United States Patent
Milicevic et al.

(10) Patent No.: US 7,528,669 B2
(45) Date of Patent: May 5, 2009

(54) DELAY CELL FOR VOLTAGE CONTROLLED OSCILLATOR INCLUDING DELAY CELLS CONNECTED AS A RING OSCILLATOR

(76) Inventors: Sinisa Milicevic, 322-2055 Carling Ave., Ottawa, ON (CA) K2A 1G6; Leonard MacEachern, 903-171 Lees Ave., Ottawa, ON (CA) K1S 5P3; Samy Mahmoud, 21 County Club Drive, Ottawa, ON (CA) K1V 9W1

( * ) Notice: Subject to any disclaimer, the term of this patent is extended or adjusted under 35 U.S.C. 154(b) by 40 days.

(21) Appl. No.: 11/288,389

(22) Filed: Nov. 29, 2005

(65) Prior Publication Data

US 2007/0008043 A1   Jan. 11, 2007

Related U.S. Application Data

(60) Provisional application No. 60/697,533, filed on Jul. 11, 2005.

(51) Int. Cl.
*H03K 3/03* (2006.01)
*H03H 11/26* (2006.01)

(52) U.S. Cl. .................. 331/57; 331/113 R; 327/266

(58) Field of Classification Search ............... 327/266, 327/274, 287; 331/45, 57, 113 R, 111, 135, 331/137, 143

See application file for complete search history.

(56) References Cited

U.S. PATENT DOCUMENTS

| | | | | |
|---|---|---|---|---|
| 2,787,712 | A * | 4/1957 | Priebe, Jr. et al. | 331/113 R |
| 3,445,788 | A * | 5/1969 | Camenzind | 332/110 |
| 5,317,287 | A * | 5/1994 | Brown | 331/57 |
| 5,629,652 | A * | 5/1997 | Weiss | 331/108 B |
| 6,118,316 | A * | 9/2000 | Tamamura et al. | 327/156 |
| 6,545,555 | B1 * | 4/2003 | Justice et al. | 331/117 R |
| 6,850,106 | B1 * | 2/2005 | Kunanayagam et al. | 327/266 |
| 7,345,528 | B2 * | 3/2008 | Zanchi et al. | 327/562 |

* cited by examiner

*Primary Examiner*—Robert Pascal
*Assistant Examiner*—Levi Gannon
(74) *Attorney, Agent, or Firm*—Marks & Clerk; Richard J. Mitchell

(57) ABSTRACT

A delay cell for use in a voltage controlled oscillator includes a differential amplifier having a pair of outputs, a common source resistive element supplying current to said differential amplifier, a varactor arrangement between the outputs having a control input, and a pair of load resistive elements connected to the respective outputs. The delay cell has a simple design, a small die area, low power dissipation, constant amplitude of oscillation versus control voltage, and a Figure of Merit (FOM) comparable to that of LC oscillators.

16 Claims, 3 Drawing Sheets

DELAY CELL FOR VOLTAGE CONTROLLED OSCILLATOR INCLUDING DELAY CELLS CONNECTED AS A RING OSCILLATOR

CROSS REFERENCE TO RELATED APPLICATION

This application claims the benefit under 35 USC 119(e) for prior U.S. provisional application No. 60/697,533, filed Jul. 11, 2005, the contents of which are herein incorporated by reference.

FIELD OF THE INVENTION

This invention relates to the field of voltage-controlled ring oscillators, and in particular to a delay cell for use in such oscillators.

BACKGROUND OF THE INVENTION

Timing circuits are required for many applications in digital systems. The basis of most timing circuits is the phase locked loop (PLL), which can be used in frequency synthesis, clock and data recovery, and synchronization. A phase-locked loop is a closed loop feedback system that maintains a generated signal in a fixed phase relationship to a reference signal. A critical element of the PLL is the voltage controlled oscillator, which generates the output signal of the PLL.

The voltage controlled oscillator usually comprising an LC oscillator. LC oscillators are known to offer excellent phase noise and frequency response, but they are unsuitable for small-scale CMOS integration since they are limited in size by the need for the inductors, which do not scale appropriately with decreasing MOSFET size.

Ring oscillators scale better than LC oscillators, but have not in the past performed as well as LC oscillators.

SUMMARY OF THE INVENTION

The invention permits the fabrication of a voltage controlled oscillator with improved characteristics suited for small scale CMOS applications.

The invention employs a delay cell in a ring oscillator that has a simple design, a small die area, low power dissipation, constant amplitude of oscillation versus control voltage, and a Figure of Merit (FOM) comparable to that of LC oscillators. The invention is particularly well suited for use in multi-band radio systems.

According to the present invention there is provided a delay cell for use in a voltage controlled oscillator comprising a differential amplifier having a pair of outputs; a common resistive element supplying current to said differential amplifier; a varactor arrangement between said outputs having a control input; and a pair of load resistive elements connected to said respective outputs. The invention also extends to a voltage controlled oscillator comprising a plurality of such delay cells in cascade.

The resistive elements may typically be single resistors, although they could be by any equivalent resistive circuit or arrangement.

In another aspect the invention provides a method of determining the frequency of oscillation of ring oscillator comprising N delay stages, each delay stage including a differential amplifier having a pair of outputs; a common source resistive element supplying current to said differential amplifier; a varactor arrangement between said outputs having a control input; and a pair of load resistive elements connected to said respective outputs, said method comprising computing the frequency of oscillation by evaluating the expression:

$$f_{osc} = \frac{-B_1 + \sqrt{B_1^2 + 4B_2\left(\tan\frac{\pi}{N}\right)^2}}{2\pi B_2 \tan\frac{\pi}{N}}$$

where $B_1$ and $B_2$ depend on the circuit parameters defined herein.

DETAILED DESCRIPTION OF THE PREFERRED EMBODIMENTS

The novel delay cell in accordance with the principles of the invention employs a resistive element, such as a resistor, as a common source for a differential amplifier. By using a resistive element instead of a common current source, the performance of the oscillator can be considerably improved.

Figure 1A:
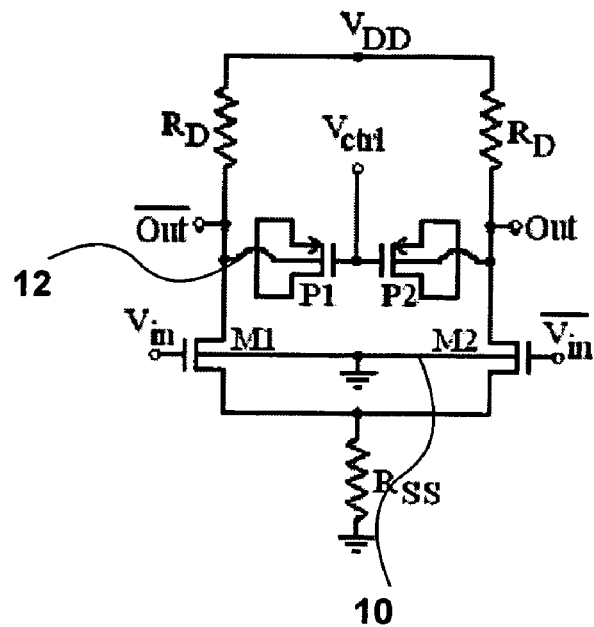
FIG. 1a shows a delay cell with one finger.

The delay cell shown in FIG. 1a comprises a differential amplifier 10 consisting of a pair of n-channel MOSFETs M1 and M2 having their substrates connected to ground. The gates of the MOSFETs M1 and M2 are connected to voltage inputs Vin and $\overline{\text{Vin}}$.

Figure 2A:
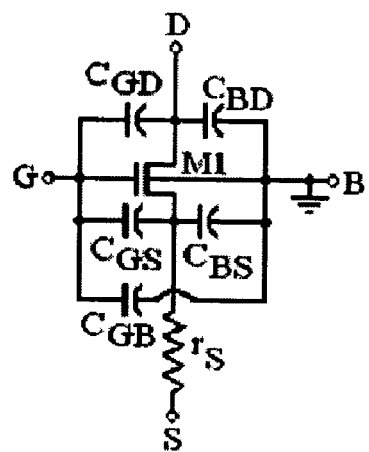
FIG. 2a shows a simple model for MOS transistor.

The sources of the MOSFETs M1 and M2 are connected to ground through a common source resistor $R_{SS}$. The drains are connected through respective load resistors $R_D$ to $V_{DD}$. FIG. 2a shows an equivalent circuit for the MOSFETs.

Figure 2B:
FIG. 2b shows a simple model for a varactor.

A varactor arrangement of fingers 12 is connected between the drains of the MOSFETs M1 and M2. The varactor arrangement consists of a pair of p-channel MOSFETs P1 and P2 connected at their gates. The common gate connection provides the control input, $V_{ctrl}$. The substrates are connected to the drains, and the source of each p-channel MOSFET is connected to its drain. FIG. 2b shows an equivalent circuit for the varactors.

The p-channel MOSFETs have a channel length of 0.18 μm and a width of 2.5 μm. They operate in both the depletion and accumulation regions. The differential pair of n-channel MOSFET transistors have a channel length of 0.18 μm and a width of 2.5 μm×4.

Figure 1B:
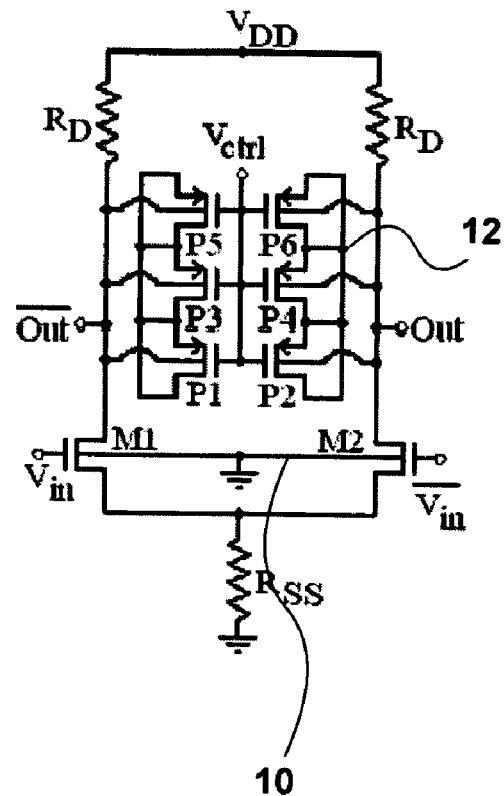
FIG. 1b shows a delay cell with three fingers.

The delay cell shown in FIG. 1a was used to design three-, five-, and seven-stage ring oscillators with center frequencies of 1800 MHz, 1900 MHz, and 2400 MHz respectively. The delay cell shown in FIG. 1b was used to design three-, five-, and seven-stage ring oscillators with center frequencies of 450 MHz, 700 MHz, and 900 MHz respectively as well as three-stage ring oscillators with center frequencies of 1800 MHz, 1900 MHz, and 2400 MHz.

In order to understand the operation of the delay cell in accordance with the invention, it is helpful to consider a simple model. The varactors are represented with a lumping equivalent varactor resistance and a lumped variable varactor capacitance. The n-channel MOSFETs are represented by an ideal transistor surrounded by its gate and diffusion capacitance. Although it is known that the delay stage is used to design a voltage-controlled oscillator and that large signals are expected, the ideal transistor is treated assuming small signals.

If the common-mode signals are neglected, then the simplified transfer function in the frequency domain for one stage is given by $$H(j\omega) = -G_m R_D \cdot \frac{1 + j\omega C_{var} R_{var}}{(1 - b_2 \omega^2) + b_1 j\omega} \quad (1)$$

where $$b_1 = C_{var} R_{var} + R_D(C_{var} + C_{eqv}) \quad (2)$$

$$b_2 = R_D R_{var} C_{var} C_{eqv} \quad (3)$$

$$C_{eqv} = C_1 + C_2 + C_{BD} + C_{GB} + C_{GS} \quad (4)$$

$$C_1 = C_{GD}\left(1 + \frac{1}{2} G_m R_D\right) \quad (5)$$

$$C_2 = C_{GD}\left(1 + \frac{2}{G_m R_D}\right) \quad (6)$$

Figure 3:
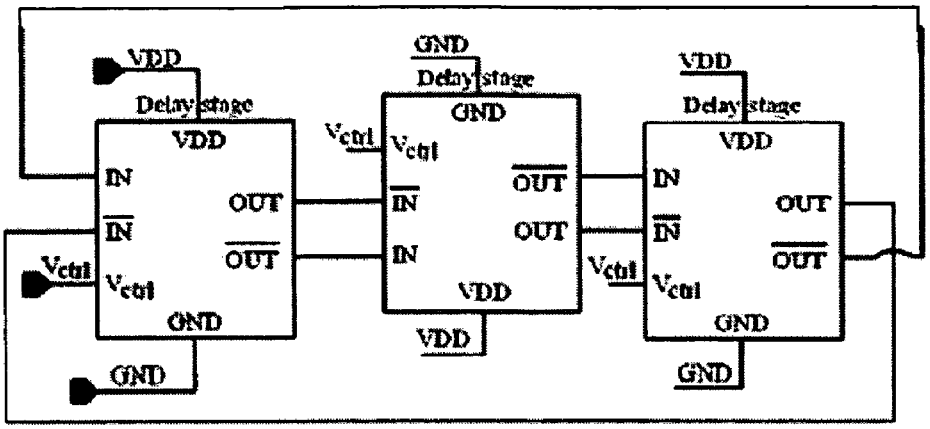
FIG. 3 is a block diagram of a three-stage ring oscillator using delay cells in accordance with the invention.

FIG. 3 shows a three-stage voltage-controlled ring oscillator made up of delay cells of the type shown in FIG. 1a. The cells 30 are connected in a tandem feedback arrangement. The loop gain for this system is, $$\beta A = H(j\omega) \cdot H(j\omega) \cdot H(j\omega). \quad (7)$$

Following the Barkhausen criteria, each stage should contribute 60° phase shift in order the oscillation to start, $$\angle(H(j\omega)) = \frac{\pi}{3} \text{ radians.} \quad (8)$$

In the case of the ring oscillator configured with N-stages, each stage should contribute $$\angle(H(j\omega)) = \frac{\pi}{N} \text{ radians} \quad (9)$$

phase shift in order for the feedback system to oscillate. Equations (1) and (9) together give $$-\tau_2 \cdot \omega^3 + B_2 \tan\left(\frac{\pi}{N}\right) \cdot \omega^2 + B_1 \cdot \omega - \tan\left(\frac{\pi}{N}\right) = 0 \quad (10)$$

where $\tau_{var} = C_{var} R_{var}$, $B_2 = b_2 + b_1 \cdot \tau_{var}$, $\tau_2 = b_2 \cdot \tau_{var}$, and $B_1 = b_1 + \tau_{var}$. The approximated frequency of oscillation for the ring oscillator with N-stages can be calculated from, $$f_{osc} = \frac{-B_1 + \sqrt{B_1^2 + 4B_2\left(\tan\frac{\pi}{N}\right)^2}}{2\pi B_2 \tan\frac{\pi}{N}}. \quad (11)$$

The equation (11) gives the frequency of oscillation for the feedback system with N-stages. In deriving this expression, the parasitic capacitances due to the layout, such as the overlap capacitances between the metal layers, fringing capacitances, and overlap capacitances between the metal layers and the substrate were ignored. In addition, a source-follower buffer with an n-channel MOSFET with 2.5 μm×5 in width and 0.18 μm in length and one resistor with 444~ was used. In an ideal situation, the buffer should not load the VCO output. However, in reality the buffer input impedance will load the VCO. It can be shown that the input impedance of the buffer can be assumed as pure capacitive. To simplify the analysis, this capacitance is assumed as parasitic capacitance as well.

The parasitic capacitances were assumed to be distributed throughout the circuit and appear in parallel to the capacitances used in analysis. That means that the value of the capacitors already incorporated during the analysis are increased by the value of the parasitic capacitances. Although each capacitor will see different parasitic capacitance due to the layout, for simplification it can be assumed that each capacitance see additional an average parasitic capacitance Cpar. Hence, if the value of the varactor capacitance Cvar is replaced by Cvar+Cpar, as well as the value of Ceqv is replaced by Ceqv+5•Cpar then the derived formula (11) is more accurate and closer to reality.

Figure 4:
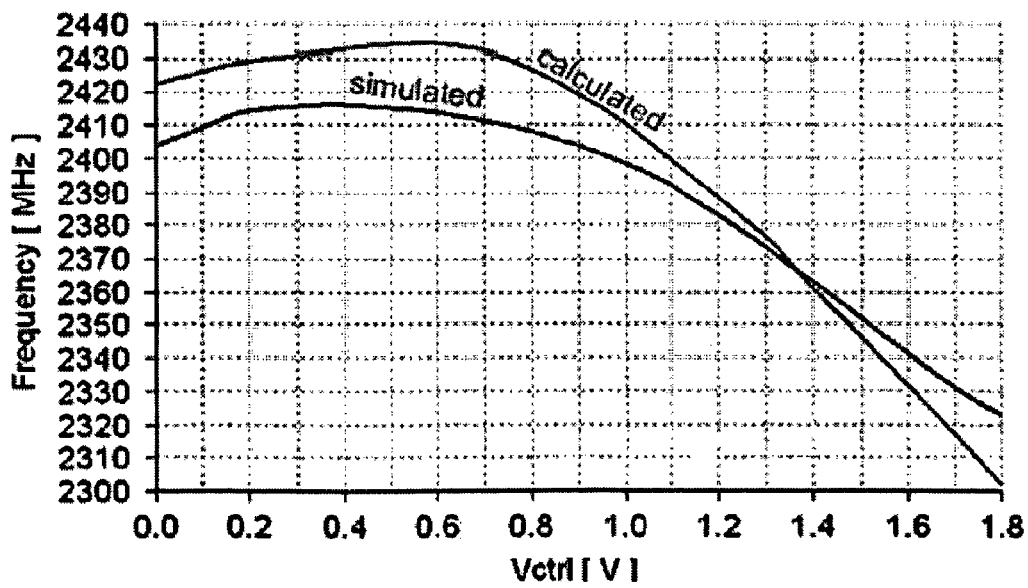
FIG. 4 shows the calculated and simulated tuning characteristic for a 2400 MHz ring oscillator.

FIG. 4 shows the calculated and simulated tuning characteristic of the 2400 MHz ring oscillator with three stages and varactor with one finger. From the simulated results was found that the average value of the parasitic capacitances is approximately Cpar=2.75[fF]. The maximum deviation between the simulated and calculated curve is 1%.

Table 1 shows the calculated sensitivity of the frequency of oscillation due to ±50% variations of the MOSFET parameters.

TABLE I

| ±50[%] | $C_{BD}$ | $C_{GB}$ | $C_{GD}$ | $C_{GS}$ | $G_m$ |
|---|---|---|---|---|---|
| $f_{osc}$[%] | ±5.0 | ±2.3 | ±17.4 | ±8.0 | ±5.2 |

The effect of the MOSFET parameters on the estimated frequency of oscillation a three-stage ring oscillator with center frequency at 900[MHz] was considered.

If the nominal value of the frequency of oscillation is assumed when Vctrl=0.9[V] then Table I shows the sensitivity of the derived formula (11) if some of the parameters such as CBD, CGB, CGD, CGS, and Gm change the value by ±50%. The idea is to show that the ±50% does not result in abrupt changes of the estimated oscillation frequency. Note that the actual deviation is expected to be less than 50%. The 50% error was taken as an extreme. According to the Table I, the gate-to-drain CGD capacitance is the most critical parameter in estimating the frequency of oscillation.

Table II shows how the frequency of oscillation for some measured ring oscillators is affected due to process tolerance of the resistor $R_{DD}$.

TABLE II

| RO | N | Varactor | $R_{DD}$ [%] | $f_{osc}(R_{DD})$ [%] |
|---|---|---|---|---|
| 1800 | 3 | ×1 | −24.4 | 32.2 |
| 1900 | 3 | ×1 | −21.9 | 28.0 |
| 2400 | 3 | ×1 | −12.6 | 14.4 |
| 1800 | 5 | ×1 | +7.4 | −6.9 |
| 1900 | 5 | ×1 | +17.4 | −14.8 |
| 2400 | 5 | ×1 | +24.1 | −19.4 |
| 1800 | 7 | ×1 | +34.3 | −25.5 |
| 1900 | 7 | ×1 | +34.5 | −25.6 |
| 2400 | 7 | ×1 | +27.6 | −21.5 |

Figure 5:
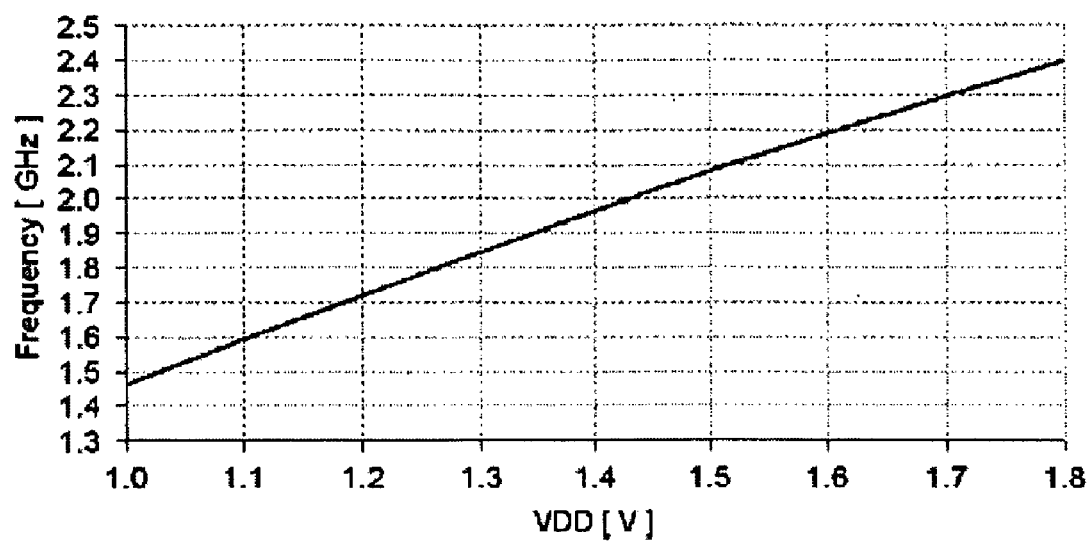
FIG. 5 shows the sensitivity in the frequency of oscillation due to changes in supply voltage for the three-stage ring oscillator.

FIG. 5 shows how the frequency of oscillation, of the three-stage 2400[MHz] ring oscillator, is sensitive to the supply voltage.

In the event the simulation tool does not take into account all capacitances associated with the oscillator's layout, then the fabricated oscillator will have "an extra" parasitic capacitance. If extra parasitic capacitance appears on the VCO loop, the value of Cvar and Ceqv will be increased. Table III shows the estimated values of Cextra and affect on the frequency of oscillation. Note that the effect of the extra capacitance can be minimized by increasing the number of stages.

It can be shown that for the N-stage ring oscillator presented in this paper the phase noise is given by It can be shown that for the N-stage ring oscillator presented in this paper the phase noise is given by $$PN = 2N \frac{\overline{i_N^2}}{V_{pp}^2 \left(1 + \left(\tan\frac{180°}{N}\right)^2\right)} \cdot \frac{R^2}{Q^2} \left(\frac{\omega_{osc}}{\Delta\omega}\right)^2 \quad (12)$$

where, if $G_m$ is known, the resistor R can be calculated from:

$$G_m R = \sqrt{1 + \left(\tan\left(\frac{180°}{N}\right)\right)^2} . \quad (13)$$

The open-loop quality factor, Q, of the system is $$Q = \frac{N}{2} \cdot \frac{\tan\frac{180°}{N}}{\sqrt{1 + \left(\tan\frac{180°}{N}\right)^2}} . \quad (14)$$

The thermal noise current per unit bandwidth is $$\overline{i_N^2} = 4kT\left(\gamma \frac{I_{SS}}{E_C L_{eff}} + \frac{1}{R_D} + \frac{1}{R_{var}}\right). \quad (15)$$

where the coefficient γ has value between 1 and 2 for short-channel devices [1], $E_C \approx 4 \times 10^6$[v/m] is the critical electric field in the silicon [1], and $R_{var}$ is the parallel resistance of the varactor.

Table IV shows the calculated, simulated and measured phase noise for some of the ring oscillators presented with this paper. Note that the flicker noise was ignored by the calculated results. The measured results were obtained by single-ended measurements.

TABLE IV

| RO [MHz] | Varactor | calculated | simulated | measured |
|---|---|---|---|---|
| 1800 | ×3 | −99.5[d] | −96.3[d] | −95.1[s] |
| 1800 | ×1 | −97.8[d] | −96.8[d] | −95.2[s] |
| 1900 | ×3 | −99.0[d] | −95.9[d] | −92.6[s] |
| 1900 | ×1 | −98.0[d] | −97.3[d] | −93.6[s] |
| 2400 | ×3 | −99.8[d] | −94.1[d] | −91.6[s] |
| 2400 | ×1 | −97.0[d] | −96.1[d] | −93.1[s] |

The stimulated tuning curve for ring oscillators incorporating the novel delay cells can be simulated with a second-order polynomial of the form:

$$F_{osc} = a_2 x^2 + a_1 x + a_0$$

where x is the control signal.

Figure 6:
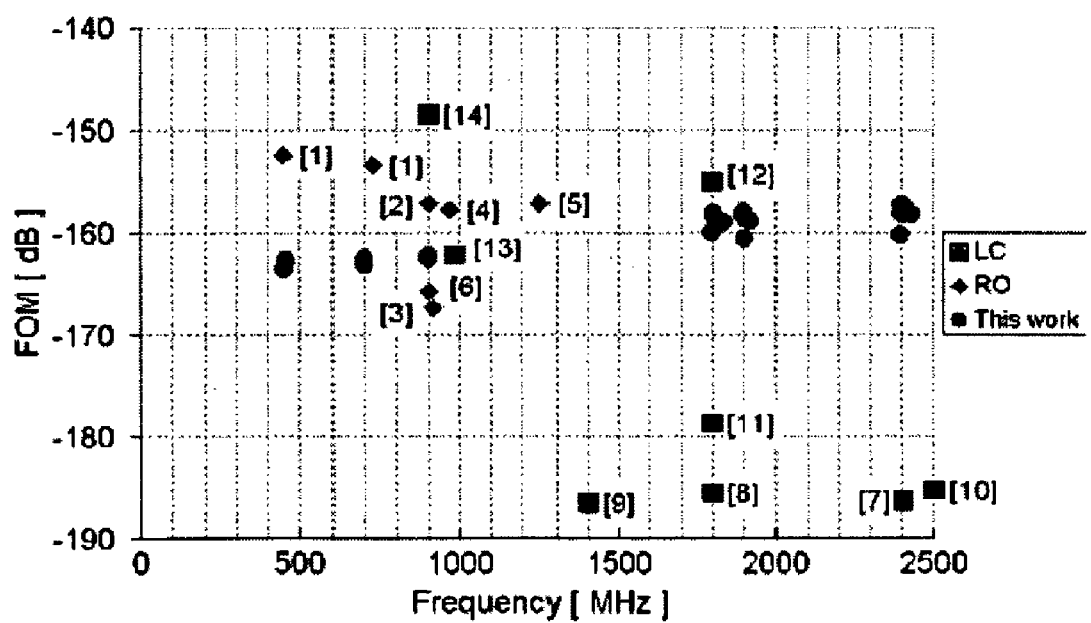
FIG. 6 shows the Figure of Merit characteristics for ring oscillators in accordance with the invention compared to the prior art.

FIG. 6 gives a comparison of the Figure of Merit (FOM) of the ring oscillators in accordance with embodiments of the invention and the prior art. The FOM was determined using the equation $$FOM = PN(\omega_0, \Delta\omega) - 10\log\left(\frac{[mW]}{P_{VCO}}\left(\frac{\omega_0}{\Delta\omega}\right)^2\right) \quad (20)$$

Table V shows the summarized results for the ring oscillators in accordance with the invention. The same table includes the calculated values for cycle-to-cylce jitter assuming a white noise in the oscillator, $$\Delta T_{cc}^2 \approx \frac{4\pi}{\omega_o^3} S_\phi(\omega)(\omega - \omega_o)^2 \quad (21)$$

where Sφ(ω) is the phase noise with the respect to the carrier, $\omega_o$ is the oscillation frequency, and (ω-$\omega_o$) is the offset frequency.

TABLE V

| N | Supply [V] | $I_{tail}$ [mA] | P [mW] | f [MHz] | $K_{vco}$ [MHz/V] | PN [dBc/Hz] | offset [MHz] | FOM [dB] | core area [μm²] | jitter [ps] | Design |
|---|---|---|---|---|---|---|---|---|---|---|---|
| 3 | 1.8 | 0.088 | 0.474 | 457[a] | 30.5 | −106.3 | 1.0 | −162.5 | 3602 | 1.81 | Invention |
| 5 | 1.8 | 0.153 | 1.377 | 453[a] | 35.5 | −111.9 | 1.0 | −163.6 | 5440 | 0.94 | Invention |
| 7 | 1.8 | 0.244 | 3.069 | 457[a] | 30.4 | −114.6 | 1.0 | −162.9 | 6623 | 0.68 | Invention |
| 3 | 1.8 | 0.129 | 0.699 | 703[a] | 48.5 | −104.7 | 1.0 | −163.1 | 3144 | 1.11 | Invention |
| 5 | 1.8 | 0.258 | 2.319 | 703[a] | 48.0 | −109.7 | 1.0 | −163.0 | 4717 | 0.63 | Invention |

TABLE V-continued

| N | Supply [V] | $I_{tail}$ [mA] | P [mW] | f [MHz] | $K_{vco}$ [MHz/V] | PN [dBc/Hz] | offset [MHz] | FOM [dB] | core area [μm²] | jitter [ps] | Design |
|---|---|---|---|---|---|---|---|---|---|---|---|
| 7 | 1.8 | 0.390 | 4.914 | 703$^a$ | 43.7 | −112.6 | 1.0 | −162.6 | 5840 | 0.45 | Invention |
| 3 | 1.8 | 0.172 | 0.931 | 903$^a$ | 57.0 | −103.1 | 1.0 | −162.5 | 2812 | 0.91 | Invention |
| 5 | 1.8 | 0.346 | 3.112 | 903$^a$ | 56.4 | −108.4 | 1.0 | −162.6 | 4717 | 0.50 | Invention |
| 7 | 1.8 | 0.510 | 6.428 | 903$^a$ | 51.2 | −111.3 | 1.0 | −162.3 | 5840 | 0.36 | Invention |
| 3 | 1.8 | 0.331 | 1.787 | 1836$^a$ | 113.7 | −96.3 | 1.0 | −159.1 | 2480 | 0.69 | Invention |
| 3 | 1.8 | 0.283 | 1.529 | 1800$^b$ | 50.8 | −96.8 | 1.0 | −160.0 | 4234 | 0.67 | Invention |
| 5 | 1.8 | 0.697 | 6.275 | 1804$^b$ | 47.6 | −101.2 | 1.0 | −158.4 | 7123 | 0.40 | Invention |
| 7 | 1.8 | 1.235 | 15.567 | 1802$^b$ | 40.5 | −105.0 | 1.0 | −158.2 | 9526 | 0.26 | Invention |
| 3 | 1.8 | 0.344 | 1.875 | 1925$^a$ | 124.5 | −95.9 | 1.0 | −158.9 | 2480 | 0.67 | Invention |
| 3 | 1.8 | 0.311 | 1.681 | 1902$^b$ | 53.4 | −97.3 | 1.0 | −160.6 | 4234 | 0.58 | Invention |
| 5 | 1.8 | 0.762 | 6.855 | 1899$^b$ | 49.0 | −101.3 | 1.0 | −158.5 | 7123 | 0.37 | Invention |
| 7 | 1.8 | 1.314 | 16.562 | 1900$^b$ | 40.8 | −104.7 | 1.0 | −158.0 | 9555 | 0.25 | Invention |
| 3 | 1.8 | 0.413 | 2.228 | 2430$^a$ | 129.2 | −94.1 | 1.0 | −158.3 | 2480 | 0.58 | Invention |
| 3 | 1.8 | 0.414 | 2.234 | 2399$^b$ | 66.6 | −96.1 | 1.0 | −160.2 | 4234 | 0.47 | Invention |
| 5 | 1.8 | 1.049 | 9.444 | 2402$^b$ | 64.3 | −100.4 | 1.0 | −158.2 | 7123 | 0.29 | Invention |
| 7 | 1.8 | 1.702 | 21.443 | 2401$^b$ | 47.5 | −103.0 | 1.0 | −157.3 | 9902 | 0.21 | Invention |
| 12 | 2.5 | 0.33 | 10.0 | 447 | n/a | −109.5 | 1.0 | −152.5 | n/a | 1.26 | Prior art |
| 8 | 2.5 | 0.50 | 10.0 | 731 | n/a | −106.2 | 1.0 | −153.5 | n/a | 0.88 | Prior art |
| 2 | 2.5 | 3.13 | 15.4 | 900 | 630 | −105.5 | 0.6 | −157.2 | 12750 | 0.42 | Prior art |
| 3 | 1.8 | 3.56 | 19.2 | 900 | 656 | −109.0 | 0.6 | −159.7 | 6750 | 0.28 | Prior art |
| 2 | 3.3 | 12.0 | 79.2 | 973 | n/a | −117.0 | 1.0 | −157.1 | n/a | 0.16 | Prior art |
| 3 | 3.3 | 0.30 | 3.0 | 1250 | 145 | −100.0 | 1.0 | −157.2 | n/a | 0.80 | Prior art |
| 4 | 3.0 | 2.50 | 30.0 | 900 | 300 | −117.0 | 0.6 | −165.8 | 99200 | 0.11 | Prior art |

$^a$—MOS varactor with three fingers
$^b$MOS varactor with one finger
$V_{ctrl} = 1.0[V]$ Improvements of the phase noise and cycle-to-cycle jitter can be accomplished by increasing the number of delay stages. Increasing the number of stages from three to five, or five to seven, or seven to nine, improved the phase noise by 4-5 dBc/Hz. By increasing the number of stages the voltage swing of the VCO output signal can increased, the delay of the stages reduced, and the switching speed increased. These effects directly improve the phase.

The ring oscillators using the delay cells of this invention can be fabricated using 0.18 μm CMOS technology. The ring oscillators have a lower power dissipation, an FOM comparable with CMOS oscillators, and a small core layout area.

We claim:

1. A delay cell for use in a voltage controlled oscillator comprising:
   a differential amplifier having a pair of outputs;
   a common source directly connected to said differential amplifier for supplying current thereto, said common source comprising only passive resistive means;
   a varactor arrangement between said outputs having a control input, said varactor arrangement comprising a pair of MOS transistors with a bulk region, each having their source and drain electrodes directly interconnected, a control terminal connected to the gates of the MOS transistors, and output terminals connected to the bulk region of the MOS transistors; and
   a pair of load resistive elements connected to said respective pair of outputs.

2. The delay cell of claim 1, comprising a plurality of said varactor arrangements connected between said respective outputs, said varactor arrangements having a common control input.

3. The delay cell of claim 1, wherein said MOS transistors are configured to operate in both the depletion and accumulation regions.

4. The delay cell of claim 3, wherein said MOS transistors are p-channel MOS transistors.

5. The delay cell of claim 4, wherein said p-channel MOS transistors have a channel length of about 0.18 μm and a width of about 2.5 μm.

6. The delay cell of claim 1, wherein said load resistive elements are resistors.

7. The delay cell of claim 1, wherein said passive resistive means supplying current is a common source resistor.

8. The delay cell of claim 7, wherein said common source resistor is directly connected between a terminal of each of said MOSFETs forming said differential amplifier and ground.

9. A voltage controlled oscillator comprising a plurality of cascaded delay cells connected as a ring oscillator, each delay cell comprising:
   a differential amplifier having a pair of outputs;
   a common source directly connected to said differential amplifier for supplying current thereto, said common source comprising only passive resistive means;
   a varactor arrangement between said outputs having a control input; and
   a pair of load resistive elements connected to said respective outputs,
   wherein said varactor arrangement comprises a pair of back-to-back MOSFETs connected at their respective gates having source, drain and gate electrodes, said MOSFETs being connected at their respective gates gate electrodes to provide a first terminal, and respective bulk regions of said MOSFETs providing a second terminal, and said source and drain electrodes of each said MOSFET being directly interconnected.

10. The voltage controlled oscillator claim 9, wherein each delay cell comprises a plurality of said varactor arrangements connected between said respective outputs, said varactor arrangements having a common control input.

11. The voltage controlled oscillator of claim 9, wherein said MOSFETs are configured to operate in both the depletion and accumulation regions.

12. The voltage controlled oscillator of claim 11, wherein said MOSFETs are p-channel MOSFETs.

13. The voltage controlled oscillator of claim 9, wherein said differential amplifier comprises a pair of MOSFETs arranged in a differential configuration, and said passive resistive means is a common source resistor.

14. The voltage controlled oscillator of claim 9, wherein said load resistive elements are resistors.

15. The voltage controlled oscillator of claim 9, wherein said passive resistive means is a common source resistor.

16. The voltage controlled oscillator of claim 15, wherein said common source resistor is directly connected between said differential amplifier and ground.

* * * * *